(12) United States Patent
Nayfeh et al.

(10) Patent No.: US 6,597,496 B1
(45) Date of Patent: Jul. 22, 2003

(54) SILICON NANOPARTICLE STIMULATED EMISSION DEVICES

(75) Inventors: Munir H. Nayfeh, Urbana, IL (US); Osman Akcakir, Urbana, IL (US); Nicholas Barry, Urbana, IL (US)

(73) Assignee: The Board of Trustees of the University of Illinois, Urbana, IL (US)

( * ) Notice: Subject to any disclaimer, the term of this patent is extended or adjusted under 35 U.S.C. 154(b) by 0 days.

(21) Appl. No.: 09/426,204

(22) Filed: Oct. 25, 1999

(51) Int. Cl.$^7$ .............................. C25F 3/12; G02F 1/37; H01S 3/19
(52) U.S. Cl. .............................. 359/343; 372/40; 372/43
(58) Field of Search .................... 359/343; 385/142; 372/40, 43

(56) References Cited

U.S. PATENT DOCUMENTS

| | | | |
|---|---|---|---|
| 4,931,692 A | | 6/1990 | Takagi et al. |
| 5,308,804 A | * | 5/1994 | Lee .............................. 501/17 |
| 5,527,386 A | * | 6/1996 | Statz .......................... 106/481 |
| 5,561,679 A | * | 10/1996 | Mannik et al. ................ 372/43 |
| 5,690,807 A | | 11/1997 | Clark, Jr. et al. ............ 205/655 |
| 5,695,617 A | * | 12/1997 | Graiver et al. ......... 204/157.41 |
| 5,714,766 A | | 2/1998 | Chen et al. |
| 5,747,180 A | | 5/1998 | Miller et al. |
| 5,770,022 A | * | 6/1998 | Chang et al. ................. 204/164 |
| 5,891,548 A | * | 4/1999 | Graiver et al. ................. 428/98 |
| 5,932,889 A | | 8/1999 | Matsumura et al. |
| 5,942,748 A | * | 8/1999 | Russell et al. ........... 250/214.1 |
| 6,060,743 A | * | 5/2000 | Sugiyama et al. .......... 257/321 |

OTHER PUBLICATIONS

Credo et al, Applied Physics Letters, vol. 74, #14, pp 1978–80, Apr. 5, 1999.*
Pavesl et al, Nature, vol. 4081 pp 440–444, Nov. 23, 2000.*
Wenva et al, Materials Research Society Symp Proc., vol. 452; abstract only herewith, Dec. 6, 1996 and 1997.*
Calleins et al, Advances in prierosy talline and Nanocrystalline Semiconductases, abstract only herewith, Dec. 2, 1996.*
Shautian Le et al, Journal of Phys. Chem. B, vol. 102, #38, pp 7319–22; abst. only herewith, Sep. 17. 1998.*
Murahami et al., Oyo Batuni, vol. 67, # 7, pp 817–821; abst. only herewith, Jul. 1998.*
Sandip Tiwari, Farhan Rana, Hussein Hanafi, Allan Hartstein, Emmanuel F. Crabbé, and Kevin Chan, "A silicon nanocrystals based memory", Appl. Phys. Lett., vol. 68, No. 10, Mar. 4, 1996, pp. 1377–1379.
J. Erland, P. Yu, S.I. Bozhevolnyi, J.M. Hvam, N.N. Ledentsov, "Second harmonic spectroscopy of semiconductor nanostructures", Quantum Electronics and Laser Science Conference Technical Digest, May 1999, pp. 233–234.
D.J. DiMaria, J.R. Kirtley, E.J. Pakulis, D.W. Dong, T.S. Kuan, F.L. Pesavento, T.N. Theis, J.A. Cutro, and S.D. Brorson, "Electroluminescence studies in silicon dioxide films containing tiny silicon islands", J. Appl. Phys., vol. 56, No. 2, Jul. 15, 1984, pp. 401–416.

(List continued on next page.)

Primary Examiner—Nelson Moskowitz
(74) Attorney, Agent, or Firm—Greer, Burns & Crain, Ltd.

(57) ABSTRACT

The invention concerns elemental silicon emission devices. Devices according to the invention use elemental silicon nanoparticles as a material from which stimulated emissions are produced. Silicon nanoparticles efficiently produce emissions and act as a gain medium in response to excitation. The silicon nanoparticles of the invention, being dimensioned on an order of magnitude of one nanometer and having about 1 part per thousand or less larger than 1 nm, are an efficient emission source and forms the basis for many useful devices.

13 Claims, 3 Drawing Sheets

OTHER PUBLICATIONS

S. Juen, K. Überbacher, J. Baldauf, K.F. Lamprecht, R. Tessadri, R. Lackner, R.A. Höpfel, "Technology and Photoluminescence of GaAs Micro– and Nanocrystallites", Superlattices and Microstructures, vol. 11, No. 2, 1992, pp. 181–184.

K.A. Littau, P.J. Szajowski, A.J. Muller, A.R. Kortan, and L.E. Brus, "A Luminescent Silicon Nanocrystal Colloid via a High–Temperature Aerosol Reaction", The Journal of Physical Chemistry, vol. 97, No. 6, 1993, pp. 1224–1230.

Anton Fojtik, Arnim Henglein, "Luminescent colloidal silicon particles", Chemical Physics Letters 221, Apr. 29, 1994, pp. 363–367.

L.A. Chiu, A.A. Seraphin, and K.D. Kolenbrander, "Gas Phase Synthesis and Processing of Silicon Nanocrystallites: Characterization by Photoluminescence Emission Spectroscopy", Journal of Electronic Materials, vol. 23, No. 3, 1994, pp. 347–354.

Xinwei Zhao, Olaf Schoenfeld, Jun–ichi Kusano, Yoshinobu Aoyagi and Takuo Sugano, "Observation of Direct Transitions in Silicon Nanocrystallites", Jpn. J. Appl. Phys., vol. 33, Jul. 1, 1994, Pt. 2, No. 7A, pp. L899–L901.

S. T. Yau, D. Saltz, M. H. Nayfeh, "Laser–Assisted Deposition of Nanometer Structures Using Scanning Tunneling Microscopy", Appl. Phys. Lett., vol. 57, No. 27, Dec. 31, 1990, pp. 2913–2915.

S.T. Yau, X. Zheng, M.H. Nayfeh, "Nanolithography of Chemically Prepared Si With a Scanning Tunneling Microscope", Appl. Phys. Lett., vol. 59, No. 19, Nov. 4, 1991, pp. 2457–2459.

M. Nayfeh, "Fabrication of Nanometer Scale Structures", SPIE Institutes, vol. IS 10, (1993), pp. 200–217.

D. Andsager, J. Hilliard, J.M. Hetrick, L.H. AbuHassan, M. Plisch, M.H. Nayfeh, "Quenching of Porous Silicon Photoluminescene by Deposition of Metal Adsorbates", J. Appl. Phys., vol. 74. No. 7, Oct. 1, 1993, pp. 4783–4785.

J. Hillard, D. Andsager, L. Abu Hassan, H.M. Nayfeh, M. H. Nayfeh, "Infrared Spectroscopy and Secondary Ion Mass Spectrometry of Luminescent, Nonluminescent and Metal Quenched Porous Silicon", J. Appl. Phys., vol. 76, No. 4, Aug. 15, 1994, pp. 2423–2428.

D. Andsager, J. Hilliard, M.H. Nayfeh, "Behavior of Porous Silicon Emission Spectra During Quenching by Immersion in Metal Ion Solutions", Appl. Phys. Lett., vol. 64, No. 9, Feb. 28, 1994, pp. 1141–1143.

D. Andsager, J.M. Hetrick, J. Hillard, M.H. Nayfeh, "Diffusion of Copper in Porous Silicon", J. of Appl. Phys., vol. 77, No. 9, May 1, 1995, pp. 1–4.

J.E. Hilliard, H.M. Nayfeh, M.H. Nayfeh, "Re–Establishment of Photoluminescence in Cu Quenched Porous Silicon by Acid Treatment", J. App. Phys., vol. 77, No. 8, Apr. 15, 1995, pp. 4130–4132.

N. Rigakis, J. Hillard, L. Abu Hassan, J. Hetrick, D. Andsager, M.H. Nayfeh, "Effect of Oxidation Treatments on Photoluminescence Excitation of Porous Silicon", J. App. Phys., vol. 81, No. 8, Jan. 1, 1997, pp. 440–444.

N. Rigagis, Z. Yamani, L. Abu Hassan, J. Hilliard, M.H. Nayfeh, "Time–Resolved Measurements of the Photoluminescence of Cu–Quenched Porous Silicon", Appl. Phys. Lett., vol. 69, 1996, pp. 2216–2218.

W.H. Thompson, Z. Yamani, L.H. Abu Hassan, J.E. Greene, M. Nayfeh, "Room Temperature Oxidation Enhancement of Porous Si(001) Using Ultraviolet–Ozone Exposure", J. Appl. Phys., vol. 80, No. 9, Nov. 1, 1996, pp. 5415–5421.

Z. Yamani, W.H. Thompson, L. Abu Hassan, M.H. Nayfeh, "Ideal Anodization of Silicon", Appl. Phys. Lett., vol. 70, No. 25, Jun. 23, 1997, pp. 3404–3406.

M.H. Nayfeh, N. Rigakis, Z. Yamani, "Photoexcitation of Si–Si Surface States in Nanocrystallites", Physical Review B, vol. 56, No. 4, Jul. 15, 1997, pp. 2079–2084.

Z. Yamani, S. Ashhab, A. Nayfeh, W.H. Thompson, M. Nayfeh, "Red to Green Rainbow Photoluminescence from Unoxidized Silicon Nanocrystallites", J. Appl. Phys., vol. 83, No. 7, Apr. 1, 1998, pp. 3929–3931.

Z. Yamani, N. Rigakis, M.H. Nayfeh, "Excitation of Size Selected Nanocrystallites in Porous Silicon", Appl. Phys. Lett., vol. 72, No. 20, May 18, 1998, pp. 2556–2558.

W.H. Thompson, Z. Yamani, L. Abu Hassan, O. Gurdal, M. Nayfeh, "The Effect of Ultrathin Oxides on Luminescent Silicon Nanocrystallites", Appl. Phys. Lett., vol. 73, No. 6, Aug. 10, 1998, pp. 841–843.

M.H. Nayfeh, N. Rigakis, Z. Yamani, "Photoexcitation of Si–Si Radiative Surface States in Nanocrystallites", Mater. Res. Soc. Proc., Boston, MA, 1997.

M.H. Nayfeh, Z. Yamani, O. Gurdal, A. Alaql, "Nanostructure of Porous Silicon using Transmission Microscopy", Mater. Res. Soc. Proc., Boston, MA, 1998.

Z. Yamani, A. Alaql, J. Therrien, O. Nayfeh, M. Nayfeh, "Revival of Interband Crystallite Reflectance from Nano–crystallites in Porous Silicon by Immersion Plating", Appl. Phys. Lett., vol. 74, No. 23, Jun. 7, 1999, pp. 3483–3485.

Z. Yamani, O. Gurdal, A. Alaql, M.H. Nayfeh, "Correlation of Diffuse Scattering with Nanocrystallite Size in Porous Silicon Using Transmission Microscopy", J. Appl. Phys., vol. 85, No. 12, Jun. 15, 1999, pp. 8050–8053.

L.T. Canham, "Silicon Quantum Wire Array Fabrication by Electrochemical and Chemical Dissolution of Wafers", Appl. Phys. Lett., vol. 57, No. 10, Sep. 3, 1990, pp. 1046–1048.

A.G. Cullis, L.T. Canham, P.D.J. Calcott, "The Structural and Luminescence Properties of Porous Silicon", J. Appl. Phys., vol. 82, No. 3, Aug. 1, 1997, pp. 909–965.

J. Wang, H.B. Jiang, W.C. Wang, J.B. Zheng, F.L. Zhang, P.H. Hao, X.Y Hou, X. Wang, "Efficient Infrared–Up–22, Conversion Luminescence in Porous Silicon: A Quantum–Confinement–Induced Effect", Phys. Rev. Lett., vol. 69, No. Nov. 30, 1992, pp. 3252–3255.

J. Gole, D. Dixon, "Evidence for Oxide Formation from the Single and Multiphoton Excitation of a Porous Silicon Surface or Silicon 'Nanoparticles'", J. Appl. Phys., vol. 83, No. 11, Jun. 1, 1998, pp. 5985–5991.

F. Koch, "Models and Mechanisms for the Luminescence of Porous Si", Mater. Res. Soc. Symp. Proc., pp. 319–329.

R.P. Chin, Y.R. Shen, V. Petrova–Koch, "Photoluminescence from Porous Silison by Infrared Multiphoton Excitation" Science, vol. 270, Nov. 3, 1995, pp. 776–778.

S.I. Raider, R. Flitsch, M.J. Palmer, "Oxide Growth on Etched Silison in Air at Room Temperature", J. Electrochem. Soc., vol. 122, No. 3, Mar. 1975, pp. 413–418.

U. Neuwald, A. Feltz, U. Memmert, R.J. Behm, "Chemical Oxidation of Hydrogen Passivated Si(111) Surfaces in $H_2O_2$", J. Appl. Phys., vol. 78, No. 6, Sep. 15, 1995, pp. 4131–4136.

A. Pasquarello, M.S. Hybertsen, R. Car, "Si 2p Core–Level Shifts at the Si(001)–$SiO_2$ Interface: A First–Principles Study", Phys. Rev. Lett., vol. 74, No. 6, Feb. 6, 1995, pp. 1024–1027.

M.H. Nayfeh, N. Rigakis, Z. Yamani, "Photoexcitation of Si–Si Radiative Surface States in Nanocrystallites", Mat. Res. Soc. Symp. Proc., vol. 486, pp. 243–248.

E. Hanamura, "Very Large Optical Nonlinearity of Semiconductor Microcrystallites", *Physical Rev. B*, vol. 37, No. 3, Jan. 15, 1988, pp. 1273–1279.

G. Allan, C. Delerue, M. Lannoo, "Nature of Luminescent Surface States of Semiconductor Nanocrystallites", *Physical Rev. Lett.*, vol. 76, No. 16, Apr. 15, 1996, pp. 2961–2964.

G.M. Credo, M.D. Mason, and S.K. Buratto, "External quantum efficiency of single porous silicon nanoparticles", Applied Physics Letters, vol. 74, No. 14, Apr. 5, 1999, pp. 1978–1980.

L. Pavesl, L. Dal Negro, C. Mazzoleni, G. Franzo and F. Prlolo, "Optical gain in silicon nanocrystals", Nature, vol. 408, Nov. 23, 2000, pp. 440–443.

J.L. Heinrich, C.L. Curtis, G.M. Credo, K.L. Kavanagh, M.J. Sailor, "Luminescent Colloidal Silicon Suspensions from Porous Silicon", *Science*, vol. 255, Jan. 3, 1992, pp. 66–68.

U.S. patent application Nayfeh et al., Ser. No. 09/426,389, entitled Silicon Nanoparticle and Method for Producing the Same, filed on Oct. 22, 1999.

U.S. patent application Ser. No. 09/781,147, entitled Silicon Nanoparticle Electronic Switches, filed on Feb. 9, 2001.

U.S. patent application Ser. No. 09/572,121 entitled Silicon Nanoparticle Microcrystal Nonlinear Optical Devices, filed on May 17, 2000.

U.S. patent application Ser. No. 09/496,506 entitled Silicon Nanoparticle Field Effect Transistor and Transistor Memory Device, filed on Feb. 2, 2000.

E. Werwa, A.A. Seraphin and K.D. Kolenbrander, *Excitation Intensity and Temperature Dependent Photoluminescence Behavior of Silicon Nanoparticles*, Material Research Society Symposium Proceedings, vol. 452 pp. 129–134, 1997.

Shoutain Li, Stuard J. Silvers and M. Samy El–Shall, *Luminescence Properties of Silicon Nanocrystals*, Material Research Society Symposium Proceedings, vol. 452, pp. 141–146, 1997.

Kouichi Murakami and Tetsuya Makimura, *Silicon nanoparticles with visible light emission –Laser ablation–*, Oyo Buturi, vol. 67, No. 7, pp. 817–821, Jul. 1998 (with verified translation.

* cited by examiner

Si NANO PARTICLE MICRO CRYSTAL

Si NANO PARTICLE MICRO CRYSTAL

SILICON NANOPARTICLE STIMULATED EMISSION DEVICES

REFERENCE TO RELATED APPLICATIONS

This application is related to a copending and commonly owned application to Nayfeh et al., Ser. No. 09/426,389, entitled SILICON NANOPARTICLES AND METHOD FOR PRODUCING THE SAME, and filed On Oct. 22, 1999 and incorporated by reference herein.

This application is also related to the following co-pending applications to Nayfeh et al:

Ser. No. 09/781,147, entitled SILICON NANOPARTICLE ELECTRONIC SWITCHES, filed on Feb. 9, 2001; now U.S. Pat. No. 6,410,934

Ser. No. 09/572,121 entitled SILICON NANOPARTICLE MICROCRYSTAL NONLINEAR OPTICAL DEVICES, filed on May 17, 2000; and Ser. No. 09/496,506 entitled SILICON NANOPARTICLE FIELD EFFECT TRANSISTOR AND TRANSISTOR MEMORY DEVICE, filed on Feb. 2, 2000.

FIELD OF THE INVENTION

The present invention is in the optoelectronics field. The invention specifically concerns devices relying on the elemental silicon for stimulated emissions. According to the invention, efficient optical emissions are obtained from elemental silicon in response to electrical or optical excitation. No such capability from elemental silicon has been previously demonstrated, and is produced in the invention through a new class of material, referred to herein as silicon nanoparticles.

BACKGROUND OF THE INVENTION

A wide range of optoelectronic devices require stimulated emissions of light. Stimulated emissions are amplified and controlled light emissions. A trend is toward using optoelectronic signaling to replace signaling which relies upon conduction of electricity. Such optoelectronic signaling depends upon devices which produce stimulated emissions, such as lasers and optical amplifiers. In general, optoelectronic signaling is superior for its speed and immunity to many types of interference which affect electric signaling. It is expected that a significant leap will be realized, for example, with the perfection of computers that utilize optical signals instead of electric signals.

Many current communication systems already rely upon optical signals transmitted through optical fibers. Such systems require generation of stimulated emissions which can be modulated to transmit information. The systems may also rely upon amplification, also known as pumping, of optical signals to account for attenuation of signals over transmitted distances. Computers and communications systems are but two examples of devices which can benefit from use of optical signaling. Generally, any electronic device which uses electrical signaling may benefit from use of optical signaling instead.

There are also classes of devices which are unique to optical emissions. Laser light has many applications ranging from surgical devices, to manufacturing tools, to testing devices. Like the signaling devices, these varied devices require a source of stimulated emissions.

Group III–V semiconductors have been the primary source for obtaining stimulated emissions from a compact, semiconductor scaled devices. Group III–V materials are known as direct semi conductors. Direct semi conductors are devices in which the efficiency is as high as 30%. The Group III–V semiconductors can accordingly respond to electrical excitation with the production of significant stimulated emissions. A Group III–V layer typically forms the essential component of semiconductor devices which require stimulated emissions.

Manufacture of the Group III–V semiconductors is relatively difficult and expensive. The manufacture generally involves reactants and by-products which are hazardous. Often, separate steps and reaction chambers are required to produce the Group III–V materials thereby adding expense to the processes from which the materials are produced. Group III–V materials do not integrate well in silicon devices because of lattice mismatch. Hence integration of optics and silicon electronics is generally not considered possible with Group III–V semiconductors.

Elemental silicon, the widespread basis for electronic devices, is obviously suitable for integration into existing electronic structures. However, element silicon is an indirect semiconductor and therefore does not provide a basis for stimulated emissions. It has an extremely poor emission efficiency due to the fact that it is an indirect gap material. For indirect gap materials, emission of light requires the simultaneous release of a photon and participation of crystal vibrations in the form of phonon emission. This is the primary reason that artisans have looked to the Group III–V materials to provide stimulated emissions in electronic devices. Production of emissions from silicon would have advantages from the standpoint of its abundance as a source, and its relative benign nature compared to the components and by-products of processes used to form the Group III–V materials, and most importantly its potential of optoelectronic integration Recently, some artisans have caused porous silicon to produce light. It was first discovered in 1990 by Canham. However, stimulated emissions have not been demonstrated from porous silicon despite an abundance of experimentation and papers that have been published on the subject. Moreover, porous silicon is usually only 1–5 percent efficient. This is due, in part, to the fact that elemental silicon sub structure is not small enough and it is typically plagued with impurities and electronic defects that compete very strongly with the radiative process.

Accordingly, it is an object of the present invention to provide a heretofore unknown source for stimulated emissions in electronic devices, elemental silicon nanoparticles.

An additional object of the present invention is to provide devices which produce stimulated emissions from elemental silicon nanoparticles.

SUMMARY OF THE INVENTION

The present invention relies upon a previously unknown material as an emission source or gain media, silicon nanoparticles. This new material and a method for making the same are described in copending application Ser. No. 09/426,389, to Nayfeh et al. entitled SILICON NANOPARTICLES AND METHOD OF MAKING THE SAME. These nanoparticles, having dimensions on the order of one nanometer and about having about 1 part per thousand or less larger than 1 nm exhibit qualities unlike bulk or atomic silicon. The silicon nanoparticles may be formed into random geometric structures. The silicon nanoparticles may also be suspended in fluids, incorporated into solids, formed into crystals, and formed into device quality thin films. The nanoparticles thus form the basis for a wide range of novel devices.

The present invention thus provides elemental silicon; in the form of silicon nanoparticles having about 1 part per thousand or less larger than 1 nm, capable of stimulated emissions as the basis for devices requiring production of stimulated emissions or a gain medium. Silicon particles of the invention produce stimulated emissions as the basis for stimulated emissions in electronic devices. Crystals formed of nanoparticles produce directed emissions, indicating the nanoparticles' capability for lasing. Artisans will readily appreciate the broad ranging applicability of the invention as the basis for many devices which utilize stimulated emissions.

BRIEF DESCRIPTION OF THE DRAWINGS

Other features, objects, and advantages of the invention will be apparent by reference to the detailed description and the drawings, of which.

DETAILED DESCRIPTION OF THE INVENTION

Figure 1A:
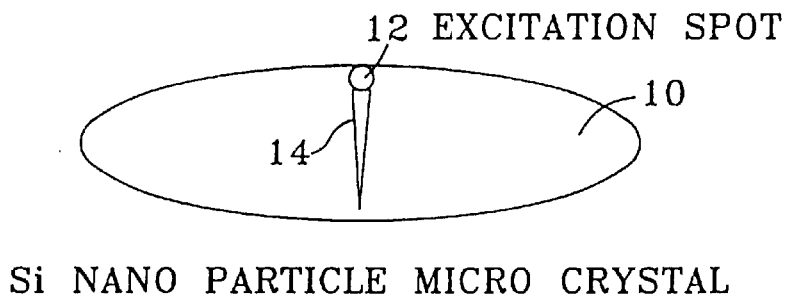
FIGS. 1a and 1b show microcrystallite stimulated emissions devices according to the present invention.

The present invention concerns stimulated emission devices which rely upon elemental silicon nanoparticles for stimulated emissions. Semiconductor lasers, optical pumps, and optical sources are exemplary devices of the invention, but artisans will appreciate that other devices are enabled by the elemental silicon stimulated emissions of the invention. Devices of the invention include silicon nanoparticles in communication with a excitation source, which may be electrical or optical. Silicon nanoparticles of the invention produce stimulated emissions.

Referring now to the drawings, there are several types of exemplary stimulated emission devices that can be constructed using the silicon nanoparticle of the invention as a gain media. The type of device will depend on the manner in which the gain media (silicon nanoparticles) are grouped, namely in crystallite, liquid, or solid form. Various types of lasers are discussed below.

Figure 1B:
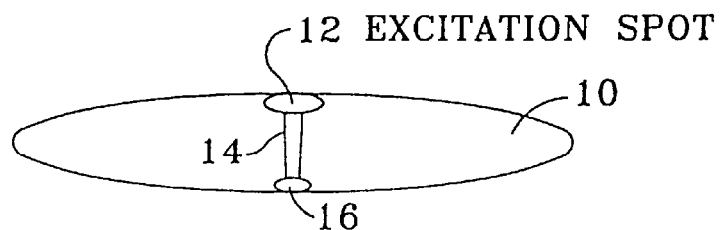

Silicon Microcrystallite Laser. In FIGS. 1a and 1b, colloidal micro crystallites 10 of the silicon nanoparticles are formed on a device quality silicon layer by gentle evaporation from a volatile acetone colloid. The micro crystals are pumped, for example, at an excitation spot 12 by femtosecond pulsed or continuous wave radiation at 780 nm. We observed blue laser action in a colloidal crystallite micro cavity, with the sides of the crystallite acting as reflectors. FIG. 1a illustrates a case where the excitation spot 12 is far away from the opposite face, or the crystal faces are insufficiently parallel. A beam 14 fades before reaching the opposite side. In FIG. 1b, with close parallel faces, a well collimated beam 14 emerges at an exit irradiation spot 16. The device may be stimulated optically or electrically.

Figure 2:
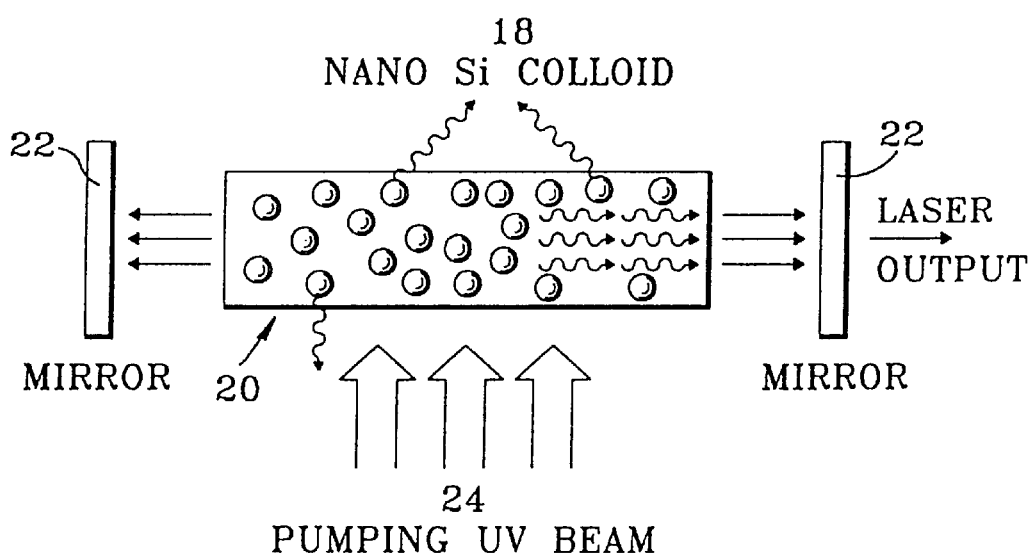
FIG. 2 shows a liquid silicon nanoparticle colloid laser device according to the present invention.

Liquid Silicon Colloid Laser. The particle gain medium is a liquid colloid 18 of the silicon nanoparticles, as seen in FIG. 2. This is analogous to the well-known concept of dye lasers. For the liquid form, the enrichment of the particles may not yield a high gain media. In this case a cavity consisting of a long channel 20 of a small diameter "capillary" provides a long pass of the gain media to offset the low particle density. Reflectors 22 provide feedback, focus and direct emissions from the ends of the narrow channel. The device is simulated optically by a pumping beam 24.

Solid Silicon Colloid Laser. The particle gain medium is a solidified colloid 26. The device structure and operation is otherwise the same as in FIG. 2. The silicon colloid may be solidified by applying an electric field to the disordered fluid. Particles take only milliseconds to form long "pearl" chains. A few seconds later, the chains aggregate into columns. Field strength of 1 KV/cm is needed to achieve solidification. Such solidification increases the linear density, hence reduce the single pass length, allowing a more compact cavity than the FIG. 2 device.

Figure 4:
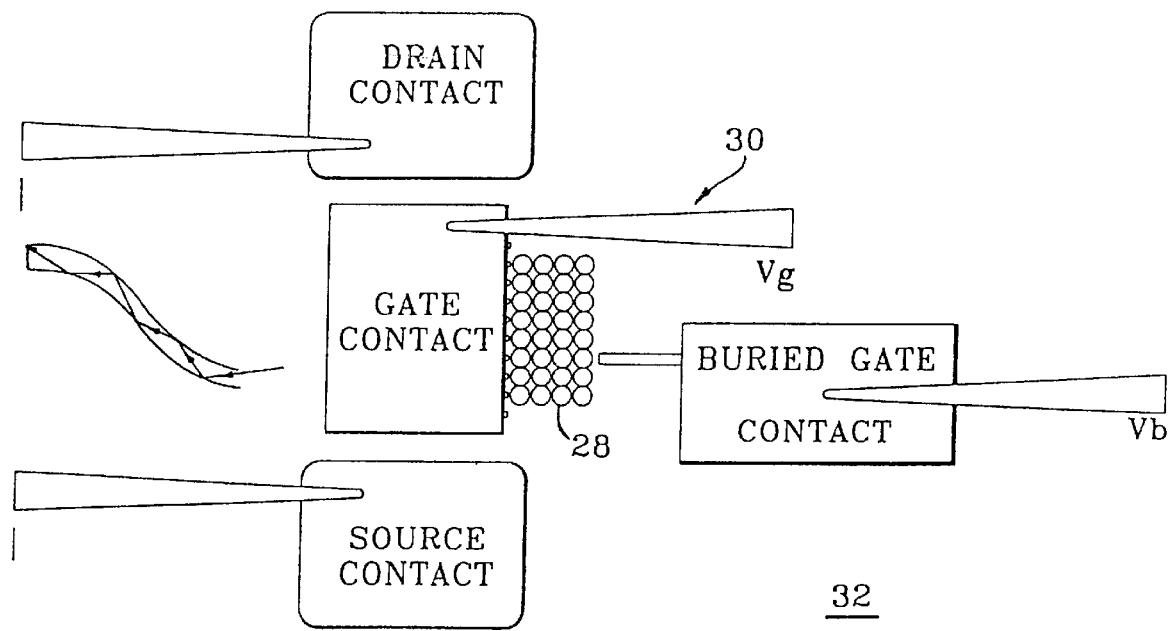
FIG. 4 shows a laser-transistor dual device in which a microcrystallite of nanoparticles that produces stimulated emissions is embedded in the gate area of a Si field effect transistor (MOSFET)

Laser-Transistor Device. This is a dual device where a microcrystallite of silicon nanoparticles 28 is embedded in the gate area 30 of a Si field effect transistor (MOSFET) 32, as shown in FIG. 4. The microcrystallite may be photo or electro stimulated to produce blue laser beams within the body of the transistor. At the same time it will operate as a single electronics device, i.e., a single electron flow should produce operation of the transistor. The device can be stimulated optically as well as electrically.

Figure 3:
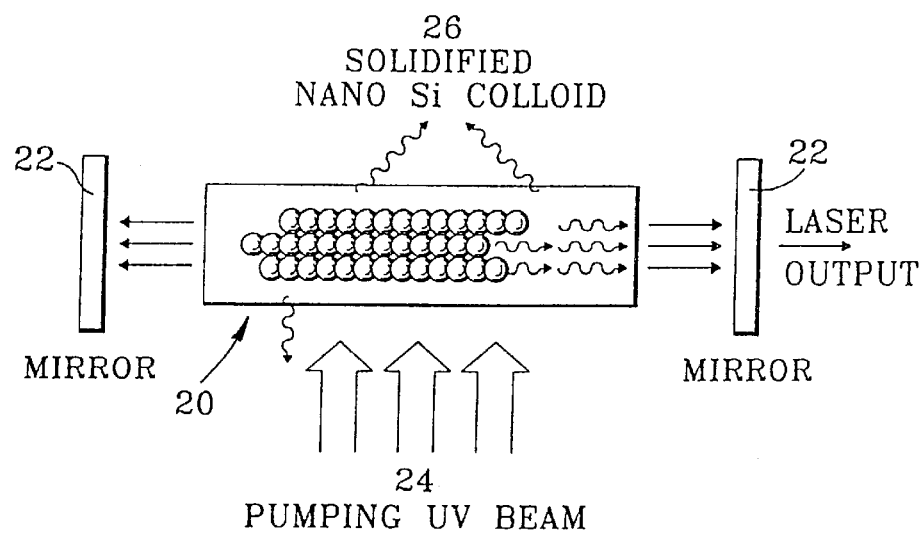
FIG. 3 shows a solid silicon nanoparticle colloid laser device according to the present invention.
Figure 5:
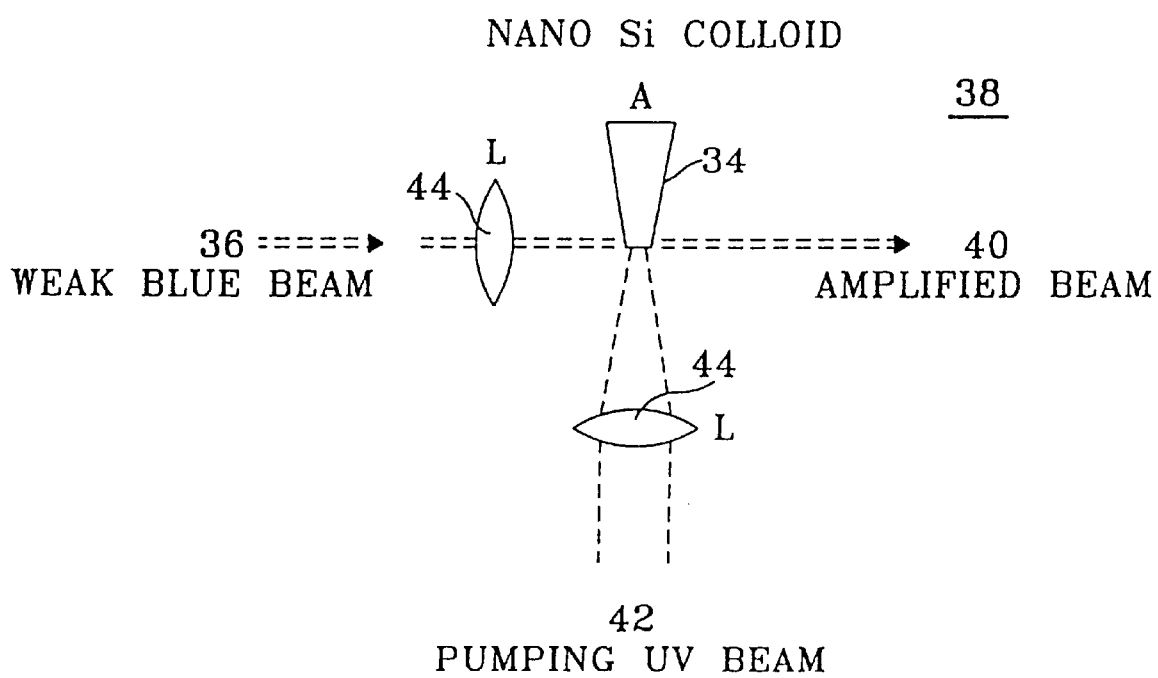
FIG. 5 shows a blue light amplifier device in which a medium of nanoparticles that produces stimulated emissions is pumped by a laser source.

Blue Light Amplifier. In this application, as shown in FIG. 5, the silicon nanoparticle material of the invention is used as a gain media 34 for amplification of a an externally injected weak blue light signal 36. The injected light 36 may be a laser beam generated by one of the above laser designs, or produced by any other type of laser system or light source. The amplifier 38 is basically realized by a silicon nanoparticle colloid as in either of FIGS. 2 or 3. There are no reflectors built into it, though, so it may not produce laser beams on its own. Instead, the signal 36 to be amplified traverses the stimulated gain media 34, picking up additional intensity by stimulated emission, and emerges as an amplified beam 40. The device is stimulated optically by a pumping beam 42, which, like the injected beam 36, may be directed by a lens 44.

There are several potential pumping schemes for the devices of FIGS. 1–5. Examples include (I) Pulsed single photon UV excitation (ii) Pulsed two-photon infrared excitation (iii) Continuous wave (CW) excitation (iv) Electron injection or electrical excitation. The basic emission principle of the invention forms a building block from which innumerable more complex devices may be constructed. The device of the invention is suitable to replace any device used as a stimulated emission source in the blue range. However, the device of the invention will also have broader applicability for several reasons.

First, the silicon nanoparticle gain media of the invention is a substantially more efficient source of stimulated emissions than conventional Group III–V sources. Whereas the Group III–V sources produce stimulated emissions at about 30 percent efficiency, the devices of the invention are expected to produce stimulated emissions near 60 percent efficiency.

The gain media of the invention also offers the potential for integration in the silicon electronics device industry. There is a great need for a multi-function chip in which more than one function are performed on the same electronic chip, such as radar transmit/receive or infrared detection coupled with digital processing, or high speed digital processing with electro-optical transmit/receive for interconnection. These different functions require different semiconductor materials which often have significant lattice mismatch between each other and the common substrate. Growing optically active materials such as III–V's on silicon layers, the backbone of electronics is not possible, at least by conventional means, because of the lattice mismatch. Thus integrating III–V or other direct-gap device materials on a silicon wafer is not generally considered feasible.

Although bulk silicon is a poor optical material, the predominance and steadily diminishing cost of Si in the electronics industry has motivated groups worldwide to work towards fabricating novel silicon based structures that might emit light efficiently. The silicon nanoparticles of the invention offer the potential of silicon based integrated optoelectronics, i.e., a marriage of optical and electronic circuits, producing new generations of faster and lower power switches and other components for telecommunications and computers.

Electronic computers use electrons in electric circuits, but the concept of optical computers is based on the use of light instead of electrons. While electronic computers have continued to advance in speed and memory at an exponential rate, doubling their clock rate every few years or so, there are inherent limitations in all electronic devices. First, electrons cannot move through each other nor can electric currents—they must always be directed through wires of some sort. This means, for example, that three-dimensional interconnections: and three-dimensional computers have always been difficult to implement—there would be just too many crossconnecting wires and switches. Yet three-dimensional structures have inherent advantages in density of processing—a 1-cm cubic array of 1-pm transistors could theoretically contain a trillion transistors or the equivalent. In addition, electrons inevitably generate heat as they move through conductors and semiconductors. This heat must be removed and puts potential limits on the density and speed of chips and multiprocessor computers. And, electronic devices operate at speeds far less than the speed of light. A typical clock step today is a few nanoseconds, but the time it takes light to get from one end of a chip to the other is a hundred times less.

Light can also travel through free space without the need for wires or fibers, and photons can travel through each other without alteration. Furthermore, energy losses from light traversing free space are negligible, allowing highly energy-efficient devices. And while electro-optic switches can slow down optical computers, some optical computations, again using interference effects, can be performed literally at the speed of light. So optical computers can be designed that are inherently three-dimensional and highly parallel.

However, optical computing has additional serious obstacles. It is difficult to fabricate optic elements that are very small, so most laboratory systems are bench-top-sized, not chip-sized. Given the strengths and weaknesses of optical computing, the initial primary applications of the silicon nanoparticle gain media of the invention in computer devices is not in replacing general-purpose electronic computers, but in narrower niches in which optical advantages are the greatest. And while optical computing can in some cases do what electronic computing does, but better and faster, the truly unique, purely optical capabilities are just now being developed for computing applications.

The most obvious application for optical computing technology are in interconnecting conventional electronic computer chips or boards. Potentially, optical interconnects may vastly increase connectivity and reduce communication times for machines with multiple processors. For example, there is potential in board-to-board interconnects on large-scale parallel processors. In such interconnects, smart-pixel arrays are driven by electronic commands from the parallel processor but use optical switching in free space to do the interconnection. Many of the early versions of such interconnects used a simple system with five elements. A square array of light sources such as LEDs or laser is focused by a single lens onto a smart-pixel array that is modulated with the output from one board. A second lens images the output of the first array onto a detector array attached to the second board. This is the optical equivalent of hardwired connections.

Silicon particle lasers could become important not only as light emitting devices for their own sake, but also for optical interconnection. As devices become smaller and faster, the circuit speed will eventually be limited by the speed of signals across the interconnecting wires. It is hoped that light waves can replace the wires to speed the processes. Thus it is hoped that the light emitted by the nano crystals may replace conducting wires in conventional silicon electronics. This newly discovered property of silicon may lead to the marriage of optical and electronic circuits that is, between computation and detection, producing new generations of faster and lower power switches and other components for telecommunications and computers The exemplary stimulated emissions devices discussed herein use optical excitation sources. Electrical excitation is expected to produce similar results. When an electron of sufficient energy strikes a silicon nanoparticle, an electron hole-pair can be excited. Once the excitation is accomplished, the remaining portion of the process, namely trapping and radiative recombination, is the same as in photo excitation, resulting in what is called electro luminescence. Another potential source of excitation is an electron beam from a near field optical microscope.

The invention is not limited to the described embodiments. Various modifications and applications will be apparent to those skilled in the art. Accordingly, the scope of the invention is to be determined by the appended claims and legal equivalents thereto.

What is claimed is:

1. A stimulated emissions source comprising:
   an excitation source;
   1 nm silicon nanoparticles having one part per thousand or less larger than 1 nm in communication with the excitation source and producing stimulated emissions in response thereto.

2. The source of claim 1, wherein said silicon nanoparticles are formed into a film.

3. The source of claim 1, wherein said silicon nanoparticles are formed into crystals.

4. The source of claim 1, wherein said silicon are formed into a solidified colloid.

5. The source of claim 1, wherein said silicon nanoparticles are formed into a liquid colloid.

6. Material for producing stimulated emissions consisting of elemental 1 nm silicon nanoparticles having one part per thousand or less larger than 1 nm.

7. Material for producing stimulated emissions comprising elemental 1 nm silicon nanoparticles having one part per thousand or less larger than 1 nm.

8. A stimulated emissions device comprising:
   a gain media of 1 nm silicon nanoparticles having one part per thousand or less larger than 1 nm;

an excitation source for said gain media;

means for directing stimulated emissions into a laser emission from the gain media.

9. The device according to claim 8, wherein said gain media comprises a silicon nanoparticle crystallite and said means for directing comprises opposing parallel faces of said silicon nanoparticle crystallite.

10. The device according to claim 8, wherein said gain media comprises a solid silicon nanoparticle colloid and said means for directing comprises mirrors.

11. The device according to claim 8, wherein said gain media comprises a liquid silicon nanoparticle colloid and said means for directing comprises mirrors.

12. The device according to claim 8, wherein said gain media comprises silicon nanoparticle crystallite and said excitation source comprises a FET transistor having the silicon nanoparticle crystallite deposited in a gate region of the FET transistor.

13. An optical amplifier comprising:

a gain media of 1 nm silicon nanoparticles having one part per thousand or less larger than 1 nm;

an excitation source for said gain media;

means for directing an input beam into the gain media.

* * * * *